(12) United States Patent
Chien

(10) Patent No.: US 7,834,707 B2
(45) Date of Patent: Nov. 16, 2010

(54) LINEARIZED CHARGE PUMP HAVING AN OFFSET

(75) Inventor: Hung-Ming Chien, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 189 days.

(21) Appl. No.: 11/314,331

(22) Filed: Dec. 22, 2005

(65) Prior Publication Data

US 2007/0096835 A1 May 3, 2007

Related U.S. Application Data

(60) Provisional application No. 60/731,489, filed on Oct. 31, 2005.

(51) Int. Cl.
*H03L 7/085* (2006.01)

(52) U.S. Cl. .................... 331/17; 331/16; 327/157; 327/536

(58) Field of Classification Search ............... 331/16, 331/17; 327/157, 536
See application file for complete search history.

(56) References Cited

U.S. PATENT DOCUMENTS

| | | | | |
|---|---|---|---|---|
| 5,945,855 A | * | 8/1999 | Momtaz | 327/157 |
| 6,236,278 B1 | * | 5/2001 | Olgaard | 331/25 |
| 6,727,735 B2 | * | 4/2004 | Park | 327/157 |
| 6,985,708 B2 | | 1/2006 | Lin et al. | |
| 7,082,176 B2 | * | 7/2006 | Chien et al. | 375/374 |
| 7,127,225 B2 | * | 10/2006 | Jaehne et al. | 455/260 |
| 7,382,849 B1 | * | 6/2008 | Groe et al. | 375/374 |
| 2003/0231729 A1 | | 12/2003 | Chien et al. | |

* cited by examiner

*Primary Examiner*—Robert Pascal
*Assistant Examiner*—James E Goodley
(74) *Attorney, Agent, or Firm*—Sterne, Kessler, Goldstein & Fox P.L.L.C.

(57) ABSTRACT

A charge pump provides charge based on a phase difference between a reference signal and a feedback signal. The relationship between the charge and the phase difference is referred to as the charge phase relationship. Charge pumps typically have a non-linear charge phase relationship. A non-linear portion of the charge phase relationship occurs about a point at which the charge and the phase difference are substantially zero. Points along charge phase relationship that represent the performance of charge pump are referred to as the charge phase characteristic of the charge pump. The charge pump includes an offset current circuit, which biases the charge pump to have a linear charge phase characteristic. For example, the charge pump is biased to have a charge phase characteristic that does not overlap with the non-linear portion of the charge phase relationship.

21 Claims, 8 Drawing Sheets

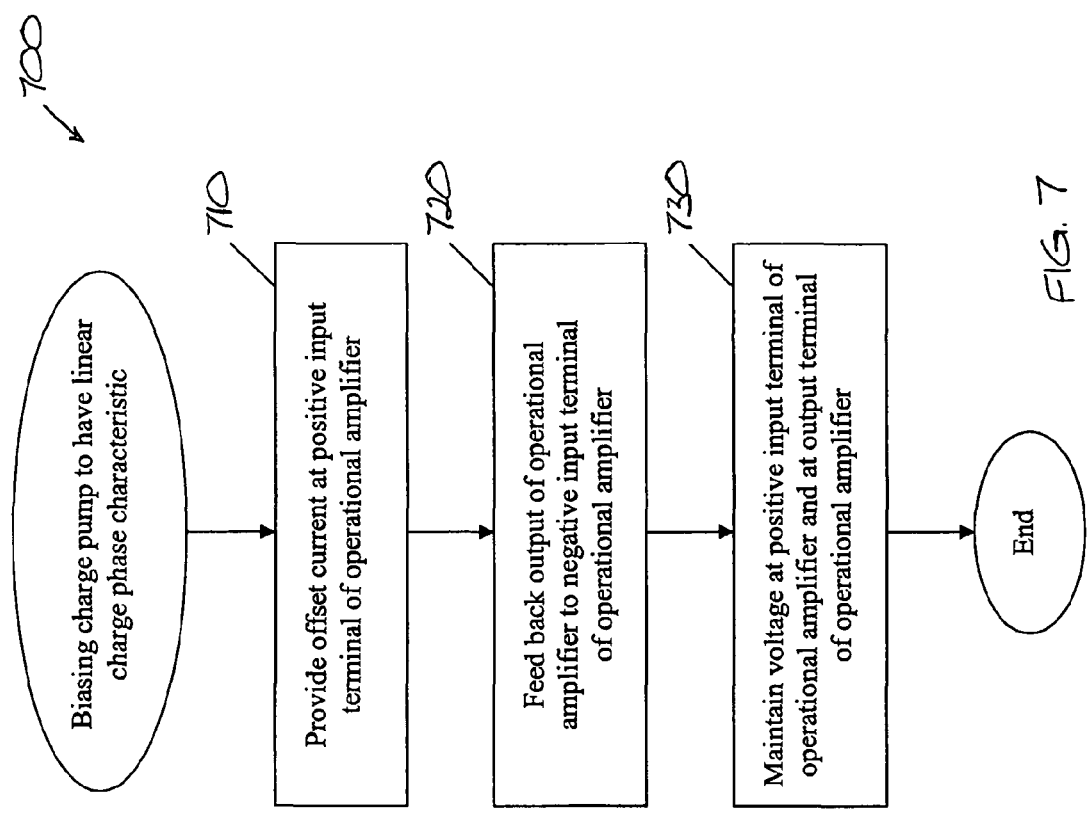

LINEARIZED CHARGE PUMP HAVING AN OFFSET

CROSS-REFERENCE TO RELATED APPLICATION

This application claims the benefit of U.S. Provisional Application No. 60/731,489, filed Oct. 31, 2005, which is incorporated herein by reference in its entirety.

BACKGROUND OF THE INVENTION

1. Field of the Invention

The present invention relates generally to circuitry, and more specifically to circuitry that includes a charge pump.

2. Background

Charge pumps are used in any of a variety of systems, such as wireless and wire line communication systems, to provide a charge based on a phase error signal. The phase error signal indicates the difference between the phase of a first signal and the phase of a second signal. A greater phase difference generally produces a greater charge at the output of the charge pump. A lesser phase difference generally produces a lesser output charge.

The relationship between the output charge of a conventional charge pump and a phase difference indicated by the corresponding phase error signal is non-linear. This non-linear relationship or other non-linearities in a system can negatively impact the performance of the charge pump and/or the system. For example, the non-linear relationship may create a spur, which is unwanted energy at a frequency other than a targeted frequency. In another example, the non-linear relationship may increase the amplitude of the noise floor associated with the charge pump and/or the system.

What is needed is a linearized charge pump and system that addresses one or more of the aforementioned shortcomings of conventional charge pumps and systems.

BRIEF DESCRIPTION OF THE DRAWINGS/FIGURES

The accompanying drawings, which are incorporated herein and form part of the specification, illustrate embodiments of the present invention and, together with the description, further serve to explain the principles of the invention and to enable a person skilled in the pertinent art(s) to make and use the invention.

FIG. 7 illustrates a flowchart of a method of biasing a charge pump to have a linear charge phase characteristic in accordance with an embodiment of the present invention.

In the drawings, like reference numbers indicate identical or functionally similar elements. Additionally, the leftmost digit(s) of a reference number identifies the drawing in which the reference number first appears.

DETAILED DESCRIPTION OF THE INVENTION

Although the embodiments of the invention described herein refer specifically, and by way of example, to wireless and wire line communication systems, including fractional-N synthesizers, it will be readily apparent to persons skilled in the relevant art(s) that the invention is equally applicable to other networks and systems. It will also be readily apparent to persons skilled in the relevant art(s) that the invention is applicable to any apparatus or system requiring a linear response.

This specification discloses one or more embodiments that incorporate the features of this invention. The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Furthermore, when a particular feature, structure, or characteristic is described in connection with an embodiment, it is submitted that it is within the knowledge of one skilled in the art to effect such feature, structure, or characteristic in connection with other embodiments whether or not explicitly described.

I. Example System Implementation

Figure 1:
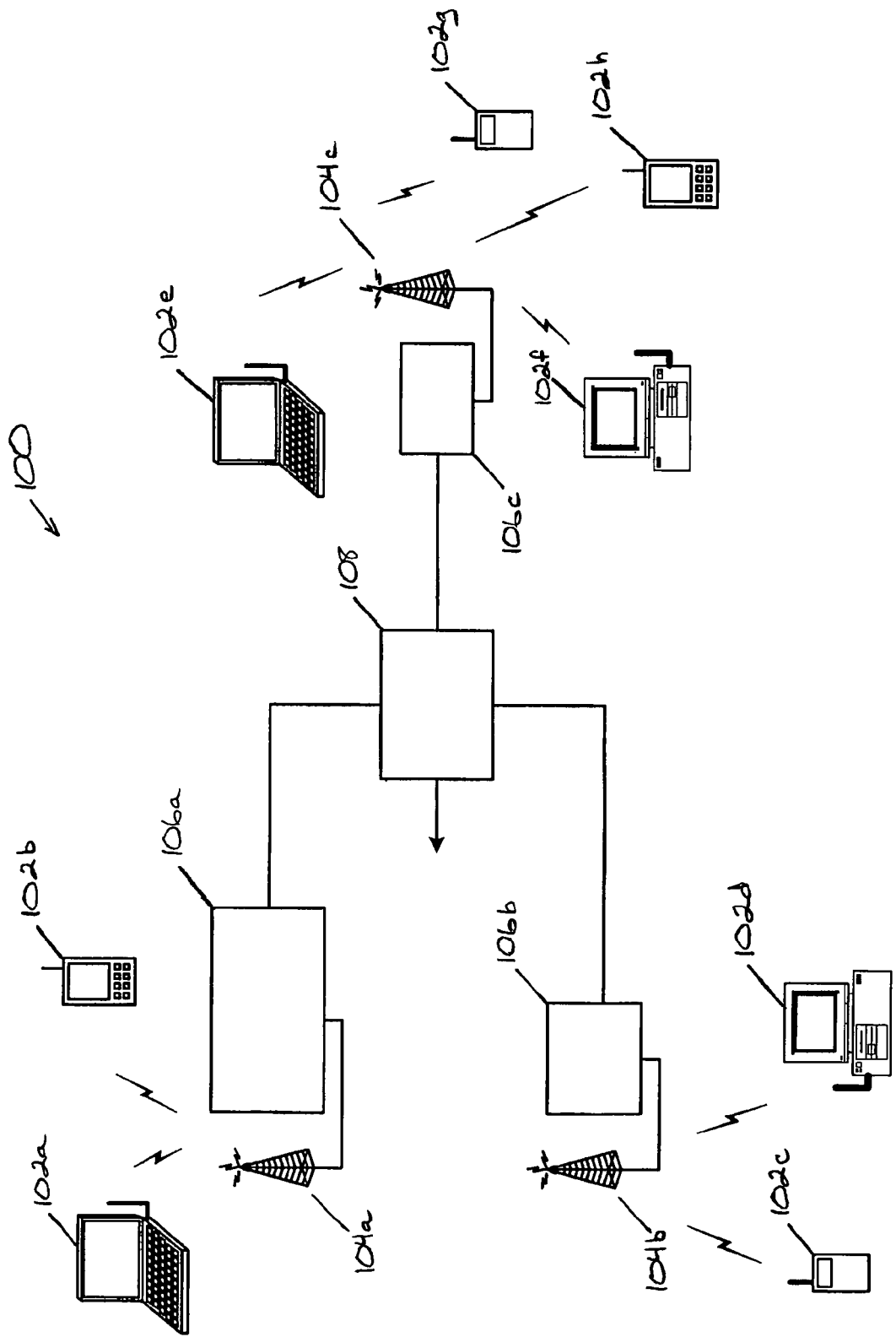
FIG. 1 is a block diagram of an example communication system, according to an embodiment of the present invention.

FIG. 1 is a block diagram of an example communication system 100, according to an embodiment of the present invention. Communication system 100 includes communication devices 102a-h, forwarding elements 106a-c, and network hardware 108. Example communication devices 102a-h include, but are not limited to, a cellular telephone, a two-way radio, a personal digital assistant (PDA), a personal computer (PC), a laptop computer, home entertainment equipment, etc.

In FIG. 1, communication devices 102a and 102e are shown to be laptop computers. Communication devices 102b and 102h are shown to be personal digital assistants. Communication devices 102c and 102g are shown to be cellular telephones. Communication devices 102d and 102f are shown to be personal computers. The example communication devices 102 shown in FIG. 1 are provided for illustrative purposes and are not intended to limit the scope of the present invention. In an aspect, at least one of communication devices 102a-h is a wireless device. In another aspect, at least one of communication devices 102a-h is hard-wired to other element(s) (e.g., a forwarding element 106) in wireless communication system 100. Communication system 100 may include any number of communication devices 102.

Forwarding elements 106a-c forward information received from respective communication devices 102a-h to network hardware 108, and/or vice versa. Example forwarding elements 106 include, but are not limited to, a base station (e.g., for a cellular service), a wireless access point (e.g., for an in-home or in-building wireless network), etc. In a first aspect, forwarding elements 106a-c process information received from respective communication devices 102a-h and provide the processed information to network hardware 108. In FIG. 1, forwarding elements 106a-c receive information from respective communication devices 102a-h via corresponding antennas 104a-c. In a second aspect, forwarding elements 106a-c process information received from network hardware 108 and provide the processed information to respective communication devices 102a-h. In FIG. 1, forwarding elements 106a-c provide the processed information to respective communication devices 102a-h via corresponding antennas 104a-c. Network hardware 108 can be any type of network hardware, including but not limited to a router, a switch, a bridge, a modem, or a system controller.

Communication devices 102a-h communicate directly and/or indirectly with each other. For direct communications (also known as point-to-point communications), receivers and transmitters of participating communication devices are tuned to the same channel or channels. For example, a channel may be one of a plurality of radio frequency (RF) carriers utilized by wireless communication system 100. The participating communication devices communicate via the channel(s) to which they are tuned.

For indirect communications, communication devices 102 communicate with each other via one or more forwarding elements 106. Each communication device 102 communicates directly with an associated forwarding element 106 via an assigned channel, and associated forwarding elements 106 communicate with each other directly via a system controller, the public switch telephone network, the Internet, and/or another network. A communication device 102 may register with a particular forwarding element 106 to receive services from communication system 100, though the scope of the invention is not limited in this respect.

Communication system 100 can operate in accordance with any of a variety of communication standards, including but not limited to IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

II. Example Communication Device

Figure 2:
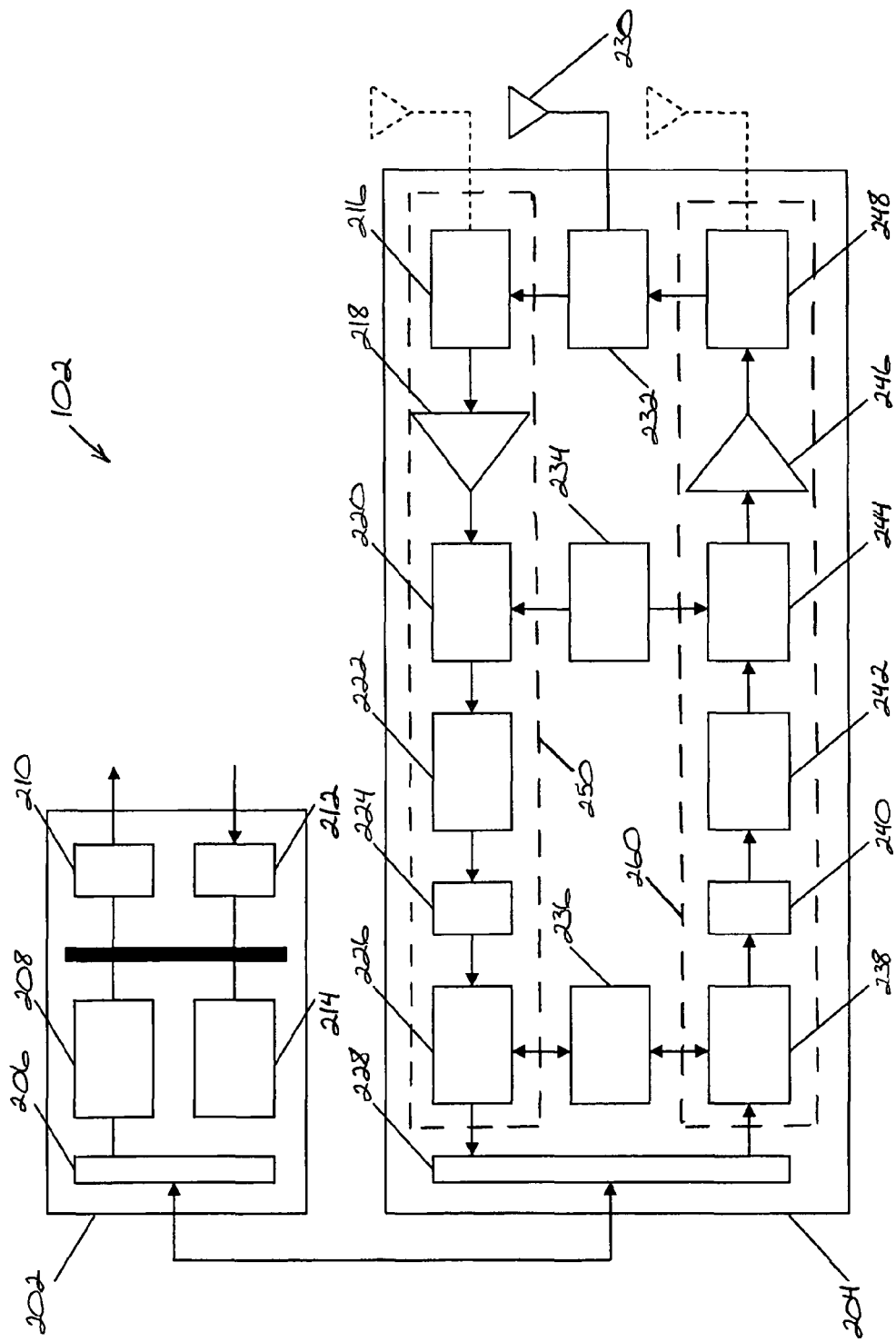
FIG. 2 is a block diagram of an example communication device, according to an embodiment of the present invention.

FIG. 2 is a block diagram of an example communication device 102, according to an embodiment of the present invention. In FIG. 2, communication device 102 includes a host device 202 and an associated radio 204. Radio 204 need not necessarily be included in communication device. In embodiments, radio 204 is externally coupled to communication device 102. For cellular telephones, radio 204 is a built-in component. For personal digital assistants, laptops, and/or personal computers, radio 204 may be built-in or an externally coupled component.

Referring to FIG. 2, host 202 includes a radio interface 206, a processing module 208, an output interface 210, an input interface 212, and a memory 214. Input interface 212 receives information (e.g., instructions or data) from any of a variety of devices, including but not limited to a keyboard, a keypad, a microphone, etc. Processing module 208 processes the information. For example, a processing module of a cellular telephone host performs operations in accordance with a cellular telephone standard. Processing module stores and/or retrieves data associated with the information, or the information itself, in memory.

Radio interface 206 allows information to be received from and sent to radio 204. Radio interface 206 provides information that is received from radio 204 to processing module 208 for processing and/or routing to output interface 210. Output interface 210 provides connectivity to an output display device (e.g., a display, a monitor, speakers, etc.) to display the information. Radio interface 206 provides information from processing module 208 to radio 204. In an aspect, processing module 208 receives information from input interface 212 or generates the information itself. Processing module 208 performs a host function to process the information and/or routes the information to radio 204 via radio interface 202.

Radio 204 includes a receive path 250, a transmit path 260, an antenna 230, a transmit/receive switch 232, a local oscillation module 234, a memory 236, and a host interface 228. Receive path 250 may be configured to perform operations including, but not limited to, digital intermediate frequency (IF) to baseband conversion, demodulation, constellation demapping, decoding, or descrambling. Transmit path 260 may be configured to perform operations including, but not limited to, scrambling, encoding, constellation mapping, modulation, or digital baseband to IF conversion.

In the embodiment of FIG. 2, receive path 250 includes a receiver filter 216, a low noise amplifier (LNA) 218, a down-conversion module 220, a filter/attenuation module 222, an analog-to-digital converter (ADC) 224, and a digital receiver processing module 226. Antenna 230 receives an in-bound radio frequency (RF) signal from a forwarding element 106. Transmit/receive switch 232 switches to a receive mode to transfer the in-bound RF signal to receiver filter 216. Receiver filter 216 band-pass filters the in-bound RF signal, and LNA 218 amplifies the filtered in-bound RF signal to provide an amplified in-bound RF signal. Down-conversion module 220 combines the amplified in-bound RF signal and a local oscillator signal to provide a down-converted signal (e.g., an intermediate frequency (IF) signal or a baseband signal). Local oscillation module 234 provides the local oscillator signal to down-conversion module 220. Filter/attenuation module 222 filters the down-converted signal and/or attenuates unwanted out-of-band signals to provide a filtered down-converted signal, which ADC 224 converts from an analog format to a digital format. Digital receiver processing module 226 processes the digital signal received from ADC 224 to recapture the in-bound RF signal received at antenna 230 in accordance with a standard associated with radio 204. Digital receiver processing module 226 can process the digital signal received from ADC 224 in any of a variety of ways, including but not limited to decoding, descrambling, de-mapping, and/or demodulating the signal received from ADC 224. Host interface provides the recaptured in-bound RF signal to host 202 via radio interface 206.

As shown in FIG. 2, transmit path 260 includes a digital transmitter processing module 238, a digital-to-analog converter (DAC) 240, a filter/gain module 242, an up-conversion module 244, a power amplifier (PA) 246, and a transmit filter 248. Host interface 228 receives an out-bound digital signal from host 202 and routes the out-bound digital signal to digital transmitter processing module 238. Digital transmitter processing module 238 processes the out-bound digital signal in accordance with a standard, such as Institute of Electrical and Electronics Engineers (IEEE) 802.11a, IEEE 802.11b, Bluetooth, etc. to provide a formatted signal (e.g., a digital baseband signal or a digital IF signal). In an aspect, digital transmitter processing module 238 provides a digital IF signal in a frequency range from approximately one-hundred kilohertz to a few megahertz. DAC 240 converts the formatted signal from a digital format to an analog format. Filter/gain module 242 filters and/or adjusts the gain of the analog signal received from DAC 240 to provide a filtered signal. Up-conversion module 244 combines the filtered signal and a local oscillator signal to provide an up-converted signal (e.g., an RF signal). Local oscillation module 234 provides the local oscillator signal to up-conversion module 244. Power amplifier 246 amplifies the up-converted signal, which is filtered by transmit filter 248 to provide an out-bound RF signal. Transmit/receive switch 232 switches to a transmit mode to transfer the out-bound RF signal to antenna 230. Antenna 230 transmits the out-bound RF signal to a targeted communication device.

In the embodiment of FIG. 2, antenna 230 is a single antenna that is shared by receive path 250 and transmit path 260, as controlled by transmit/receive switch 232. In an alternative embodiment, antenna 230 includes separate antennas for receive path 250 and transmit path 260. The antenna implementation depends on the standard with which communication device 102 is associated.

Persons of ordinary skill in the relevant art(s) will recognize that communication device 102 may be implemented using integrated circuit(s). In an aspect, host 202 is implemented on a first integrated circuit, and radio 204 is implemented on second and third integrated circuits. In this aspect, digital receiver processing module 226, digital transmitter processing module 238, and memory 236 are implemented on the second integrated circuit, and the remaining components of radio 204, except antenna 230, are implemented on the third integrated circuit. In another aspect, radio 204 is implemented on a single integrated circuit. In yet another aspect, digital receiver processing module 226 and digital transmitter processing module 238 of radio 204 and processing module 208 of host 202 constitute a processing device implemented on a common integrated circuit. In still another aspect, memories 214 and 236 are implemented on a common integrated circuit. For instance, memories 214 and 236 may be implemented on the same integrated circuit as processing module 208, digital receiver processing module 226, and digital transmitter processing module 238.

Digital receiver processing module 226 and digital transmitter processing module 238 may be implemented using a shared processing device, individual processing devices, or a plurality of processing devices. Example processing devices include, but are not limited to, a microprocessor, a microcontroller, a digital signal processor (DSP), a microcomputer, a central processing unit (CPU), a field programmable gate array, a programmable logic device, a state machine, logic circuitry, analog circuitry, digital circuitry, and/or any device that manipulates signals (e.g., analog and/or digital signals) based on operational instructions. Memory 214 or 236 may be a single memory device or a plurality of memory devices. Memory 214 or 236 may be a read-only memory (ROM), a random access memory (RAM), a volatile memory, a non-volatile memory, a static memory, a dynamic memory, a flash memory, and/or any device that stores digital information.

According to embodiments of the present invention, local oscillator module 234 includes a fractional-N synthesizer. A fractional-N synthesizer has a phase lock loop (PLL) topology that allows for fractional adjustments of a feedback signal via a multi-modulus divider. The fractional adjustments allow fine tuning of a local oscillator signal provided by local oscillator module 234. In an aspect, the fractional-N synthesizer facilitates tuning communication device 102 to an intermediate frequency (IF) or a channel.

III. Example Fractional-N Synthesizer

Figure 3A:
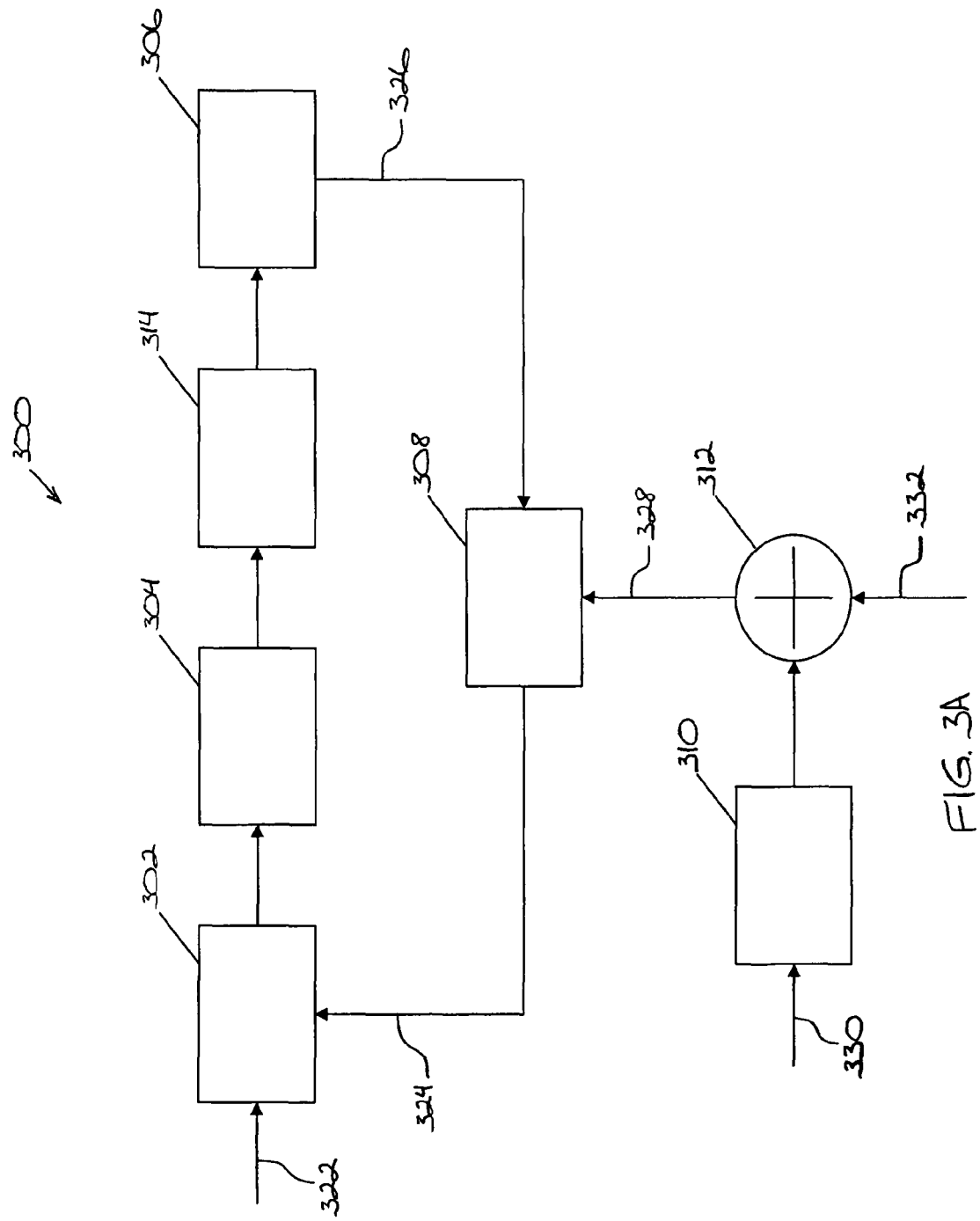
FIG. 3A and FIG. 3B are block diagrams of example fractional-N synthesizers, according to embodiments of the present invention.

FIG. 3A is a block diagram of an example fractional-N synthesizer 300, according to an embodiment of the present invention. Fractional-N synthesizer 300 includes a phase frequency detector 302, a charge pump 304, a voltage controlled oscillator (VCO) 306, a multi-modulus divider (MMD) 308, a modulator 310, an adder 312, and a loop filter 314. Phase frequency detector 302 provides a phase error signal based on a reference signal 322 and a feedback signal 324. For example, reference signal 322 has a first frequency and a first phase. Feedback signal 324 has a second frequency and a second phase. Phase frequency detector 302 compares the first phase and the second phase to determine a phase difference. The phase error signal is proportional to the phase difference. In an aspect, phase frequency detector 302 compares the first frequency and the second frequency to determine a frequency difference. In this aspect, phase frequency detector 302 generates the phase error signal based on the phase difference and the frequency difference.

Charge pump 304 provides a charge based on the phase error signal. The charge provided by charge pump 304 and the phase difference represented by phase error signal are substantially proportional. The charge provided by charge pump 304 is accumulated and filtered by loop filter 314 to generate a control voltage for voltage controlled oscillator 306. Voltage controlled oscillator 306 provides a signal 326 having a frequency that is based on the control voltage provided by loop filter 314. A relatively higher voltage provided by loop filter 314 corresponds with a relatively higher frequency for signal 326. Relatively lower voltage corresponds with a relatively lower frequency for signal 326.

In the embodiment of FIG. 3A, multi-modulus divider 308 divides the frequency of signal 326 by a value 328 received from adder 312 to provide feedback signal 324 having the second frequency. The second frequency is directly proportional to the frequency of signal 326 and inversely proportional to value 328. In another embodiment, the second frequency is directly proportional to both value 328 and the frequency of signal 326. In this embodiment, multi-modulus divider 308 multiplies the frequency of signal 326 by value 328 to provide feedback signal 324 having the second frequency.

A fractional value 330 is processed by modulator 310 (e.g., a sigma-delta modulator) and provided to adder 312. Adder 312 combines fractional value 330 and an integer value 332 to provide value 328 to multi-modulus divider 312. In FIG. 3A, adder 312 adds fractional value 330 and integer value 332 to generate value 328.

Figure 3B:
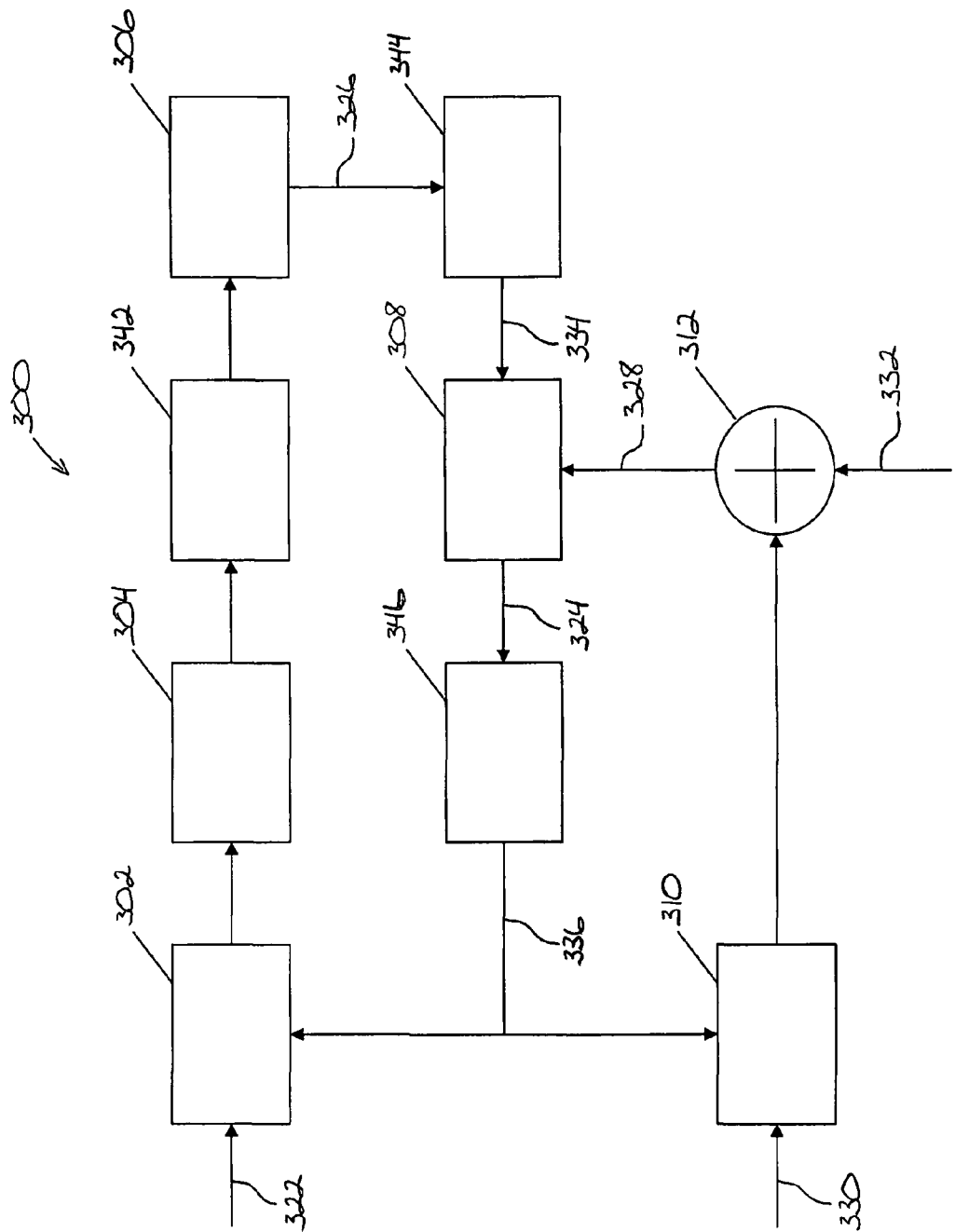

Non-linearities in the components of fractional-N synthesizer 300 can negatively effect performance of fractional-N synthesizer 300. In FIG. 3B, fractional-N synthesizer 300 includes a low pass filter (LPF) 342, a pre-scaler 344, and a re-timing block 346, any of which may be used to linearize the performance of fractional-N synthesizer 300. Low pass filter 342 is coupled between charge pump 304 and voltage controlled oscillator 306 to mitigate high-frequency noise associated with the charge provided by charge pump 304.

Pre-scaler 344 is coupled between voltage controlled oscillator 306 and multi-modulus divider 308 to generate a signal 334 based on signal 326 and having a frequency less than that of signal 326. Pre-scaler 344 divides the frequency of signal 326 by an integer value or a non-integer value to provide signal 334 to multi-modulus divider 308. Providing a lower-frequency signal to multi-modulus divider 308 reduces the power needed to operate multi-modulus divider 308, but corresponds with a higher noise floor.

Re-timing block 346 is coupled between multi-modulus divider 308 and phase frequency detector 302 to reduce jitter associated with feedback signal 324. In FIG. 3B, re-timing block 346 provides a reduced jitter feedback signal 336 to phase frequency detector 302 and to modulator 310. In an aspect, the modulated fractional value provided to adder 312 by modulator 310 is based on reduced jitter feedback signal 336.

In an aspect, jitter associated with feedback signal 324 is based on modulation of fractional value 330 that is performed by modulator 310. For example, modulation of fractional value 330 may cause a supply voltage or current of multi-modulus divider 308 to vary, thereby changing the shape of the noise floor associated with feedback signal 324.

In an ideal environment, the relationship between value 328 provided by adder 312 and the period $T_{feed}$ of feedback signal 324 is linear. In practice, however, this relationship is not necessarily linear. In an aspect, re-timing block 346 linearizes the relationship between value 328 and the period $T_{feed}$ of feedback signal 324.

Charge pump 304 and multi-modulus divider 308 are two common sources of non-linearities in fractional-N synthesizer 300. A variety of techniques can be used to linearize the performance of multi-modulus divider 308, such as coupling re-timing block 346 between multi-modulus divider 308 and phase frequency detector 302, as described above. Any of a variety of techniques may be used to linearize the performance of charge pump 304, including but not limited to biasing charge pump 304 to have a linear charge phase characteristic. In FIGS. 3A and 3B, charge pump 304 includes an offset current circuit that biases charge pump 304 to have a linear charge phase characteristic without the need for a charge down circuit.

IV. Example Charge Pump

Figure 4:
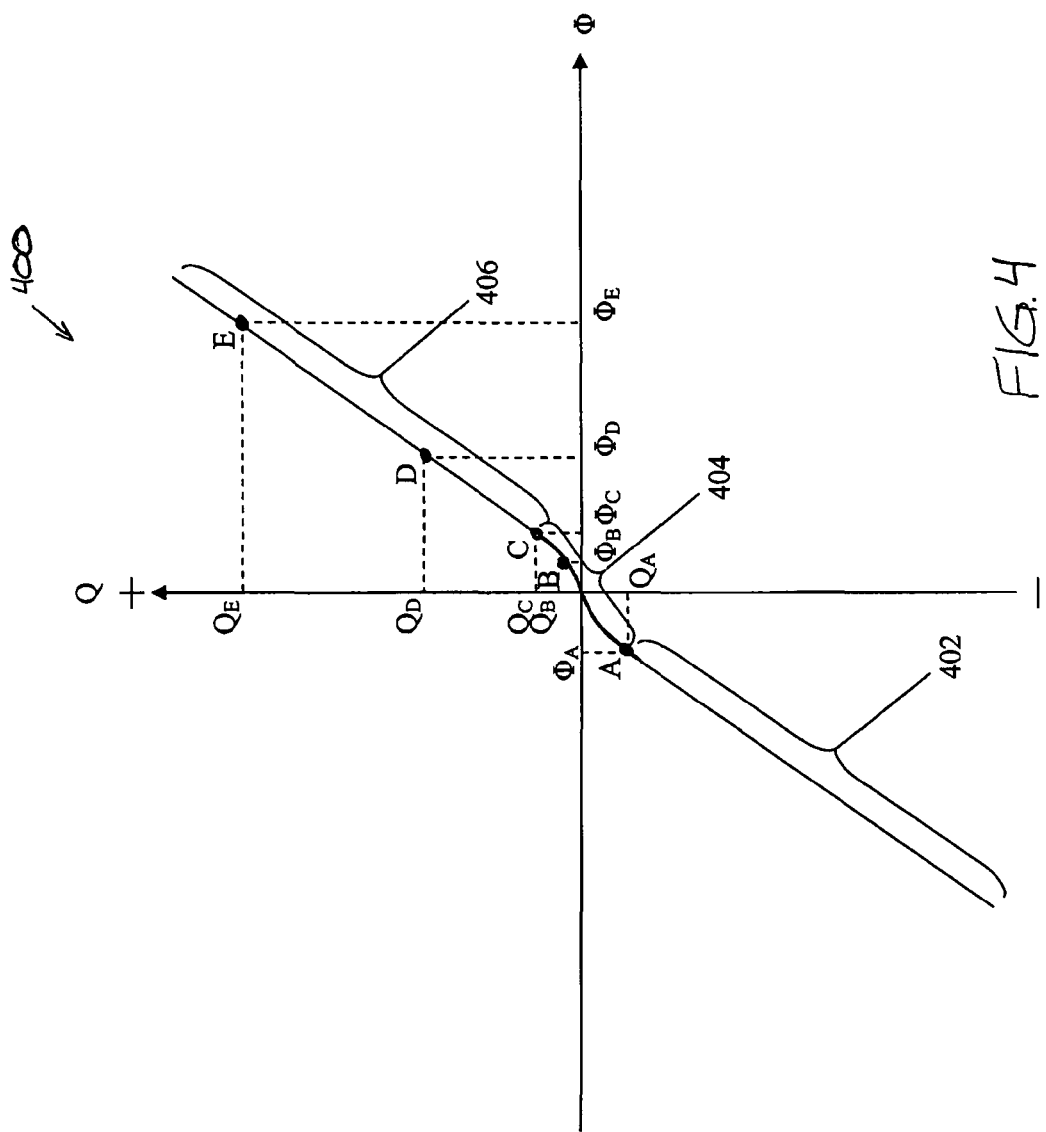
FIG. 4 illustrates a charge phase relationship of an example charge pump, according to an embodiment of the present invention.

FIG. 4 illustrates a charge phase relationship 400 of an example charge pump, such as charge pump 300, according to an embodiment of the present invention. Charge phase relationship 400 will be described with continued reference to charge pump 300 described above in reference to FIGS. 3A and 3B, though charge phase relationship 400 is not limited to those embodiments.

Referring now to FIG. 4, charge phase relationship 400 shows that the charge, Q, provided by charge pump 304 is proportional to the phase, Φ, represented by the phase error signal received by charge pump 304 from phase frequency detector 302. In an ideal environment, the relationship between the charge, Q, and the phase, Φ is linear. In practice, however, this relationship is not linear, as illustrated by charge phase relationship 400.

In FIG. 4, charge phase relationship 400 includes a first linear portion 402, a non-linear portion 404, and a second linear portion 406. Non-linear portion 404 is defined by points A and C and includes a point at which the charge, Q, is zero and the phase, Φ, is zero. This point is referred to as the "zero point" and is represented by the intersection of the Φ and Q axes shown in FIG. 4. The non-linearity of non-linear portion 404 may be based on any of a variety of factors, including but not limited to a mismatch between rise and fall times, coupling, gain variation, etc.

Biasing charge pump 304 at the zero point causes charge pump 304 to have a non-linear charge phase characteristic. In fact, biasing charge pump 304 at any point at which the charge phase characteristic of charge pump 304 overlaps with non-linear portion 404 causes the charge phase characteristic of charge pump 304 to be non-linear.

The charge phase characteristic of charge pump 304 includes points along charge phase relationship 400 that represent the performance of charge pump 304. For example, if the charge, Q, provided by charge pump 304 varies between $Q_A$ and $Q_B$, then the charge phase characteristic of charge pump 304 is the portion of charge phase relationship 400 between points A and B. As mentioned above, a charge phase characteristic that overlaps with non-linear portion 404 is non-linear. A charge phase characteristic that does not overlap with non-linear portion 404 is considered to be linear.

Referring to FIG. 4, a charge phase characteristic defined by points A and B, A and C, A and D, A and E, B and C, B and D, or B and E is a non-linear charge phase characteristic. A charge phase characteristic defined by points C and D, C and E, or D and E is a linear charge phase characteristic. According to embodiments, a non-linearity associated with charge pump 304 is linearized by biasing charge pump 304 such that the charge phase characteristic of charge pump 304 does not overlap with non-linear portion 404.

Figure 5:
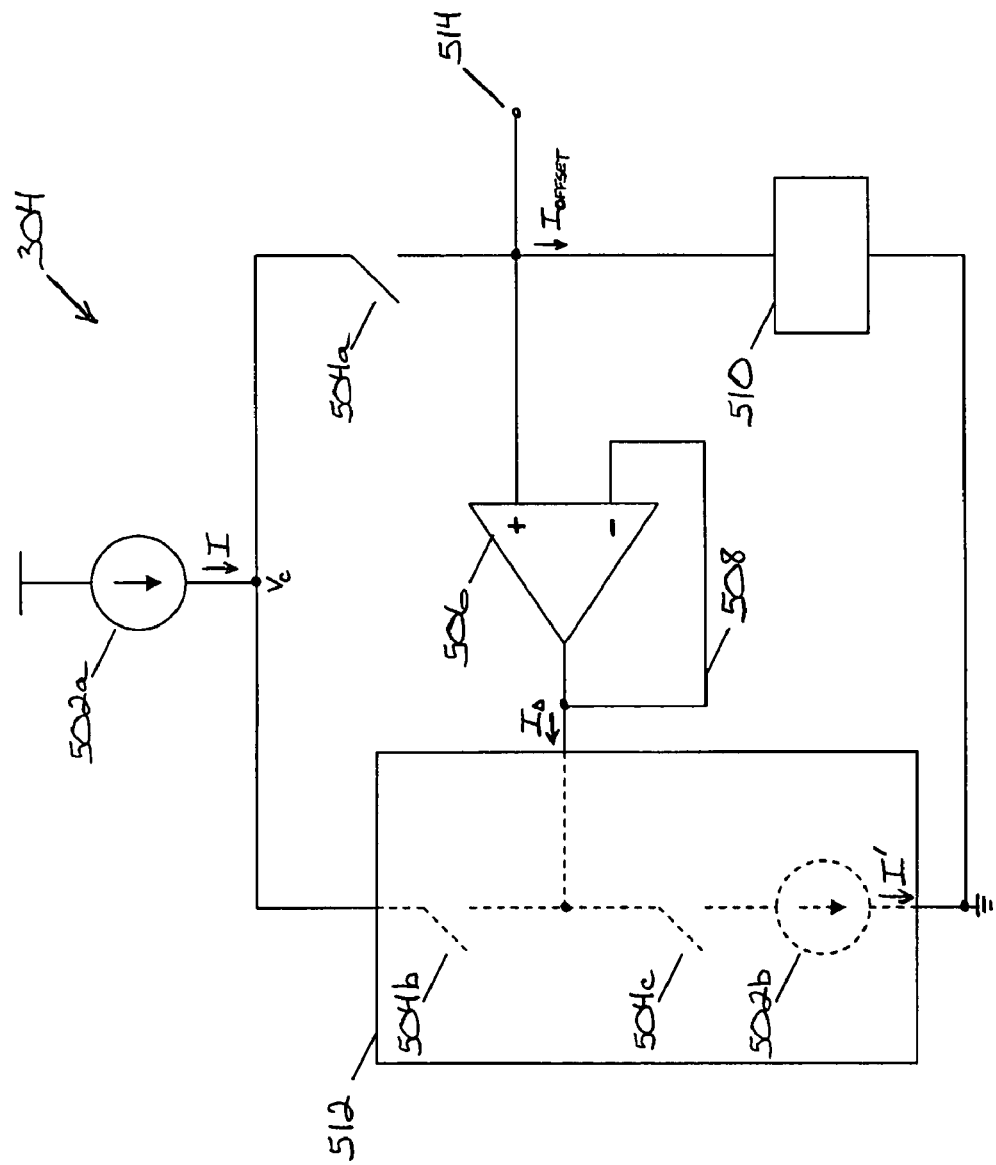
FIG. 5 and FIG. 6 are example block diagrams of a charge pump, according to embodiments of the present invention.

FIG. 5 is an example block diagram of charge pump 304, according to an embodiment of the present invention. Charge pump 304 includes a first current source 502a, a first switch 504a, an operational amplifier 506, a feedback 508, an offset current circuit 510, and a saturation maintenance circuit 512. Operational amplifier 506 has a positive input terminal ("+"), a negative input terminal ("−"), and an output terminal. The negative input terminal and the output terminal of operational amplifier 506 are coupled together by feedback 508. In an aspect, feedback includes a resistor, a capacitor, or an inductor, or any combination thereof. Operational amplifier 506 sets a voltage at the output terminal of operational amplifier 506 to be substantially the same as the voltage at the positive input terminal of operational amplifier 506. Feedback 508 facilitates setting the voltage at the output terminal. In another aspect, coupling operational amplifier 506 between first switch 504a and second switch 504b improves symmetry between first switch 504a and second switch 504b, thereby improving linearity of charge pump 304.

According to an embodiment, a parasitic switched capacitor resistor is formed by first switch 504a, a parasitic capacitance associated with node $v_C$, and second switch 504b. In this embodiment, operational amplifier 506 mitigates the effect of the parasitic switched capacitance resistors on the charge phase characteristic of charge pump 304.

Referring to FIG. 5, first switch 504a selectively increases charge at the positive input terminal of operational amplifier 506. For example, closing switch 504a routes a current I from first current source 502a to the positive input terminal of operational amplifier 506. When switch 504a is open, saturation maintenance circuit 512 facilitates the maintenance of first current source 502a in saturation. Saturation maintenance circuit 512 inhibits first current source 502a from operating in a linear region of an I-V characteristic associated with first current source 502a.

In FIG. 5, saturation maintenance circuit 512 includes second switch 504b, third switch 504c, and second current source 502b for illustrative purposes. When first switch 504a is closed, second switch 504b and third switch 504c are open. When first switch 504a is open, second switch 504b and third switch 504c are closed. In an aspect, the mismatch between a current flowing through second switch 504b and a current flowing through third switch 504c is minimized to within a few percent. In this aspect, operational amplifier 506 only needs to provide an output current equal to the mismatch between first current source 502a and second current source 502b. Third switch 504c enables operational amplifier 506 to maintain a voltage at the positive input terminal and at the output terminal of operational amplifier 506 with less power consumption, as compared to a design that does not include third switch 504c.

Saturation maintenance circuit 512 need not necessarily include third switch 504c and operational amplifier 506. In the absence of third switch 504c and operational amplifier 506, the drain of second switch 504b goes to ground and output 514 of charge pump 304 rings when second switch 504b is switched (i.e., turned on or off). The ringing at output 514 dissipates with time. Nevertheless, such ringing provides a non-linearity for charge pump 304.

Once the threshold voltage of first switch 504a is reached, first switch 504a turns on, thereby increasing the voltage at the positive input terminal of operational amplifier 506. Feedback 508 enables operational amplifier 506 to increase the voltage at the output terminal of operational amplifier 506 accordingly.

Third switch 504c enables the output terminal (and consequently the positive input terminal) of operational amplifier 506 to remain at the same voltage regardless whether (a) first switch 504a is closed and second switch 504b is open or (b) first switch 504a is open and second switch 504b is closed. In an aspect, third switch 504c reduces the turn-on delay associated with first switch 504a.

As shown in FIG. 5, first current source 502a provides current I, and second current source 502b provides current I'. Operational amplifier 506 provides current $I_A$ to enable third switch 504c to open more quickly. The current provided by second current source 502b may be represented by the equation $I'=I+I_A$. In an aspect, third switch 504c reduces current consumption of operational amplifier 506. In this aspect, operational amplifier 506 need only provide the mismatch current $I_A$ that is equal to the difference between the current I that flows through second switch 504b and the current I' that flows through third switch 504c.

Offset current circuit 510 biases charge pump 304 to have a linear charge phase characteristic. Referring back to FIG. 4, offset current circuit 510 biases charge pump 304 such that the charge phase characteristic of charge pump 304 does not overlap with non-linear region 404.

In contrast to conventional charge pumps, charge pump 304 in FIG. 5 does not include a charge down circuit coupled between the positive input terminal of operational amplifier 506 and the ground potential. The inclusion of offset current circuit 510 eliminates the need for such a charge down circuit, thereby avoiding a mismatch between a charge up current and a charge down current that may occur in conventional charge pumps. The exclusion of a charge down circuit in FIG. 5 is not intended to limit the scope of the present invention. In an aspect, charge pump 304 includes a charge down circuit.

Figure 6:
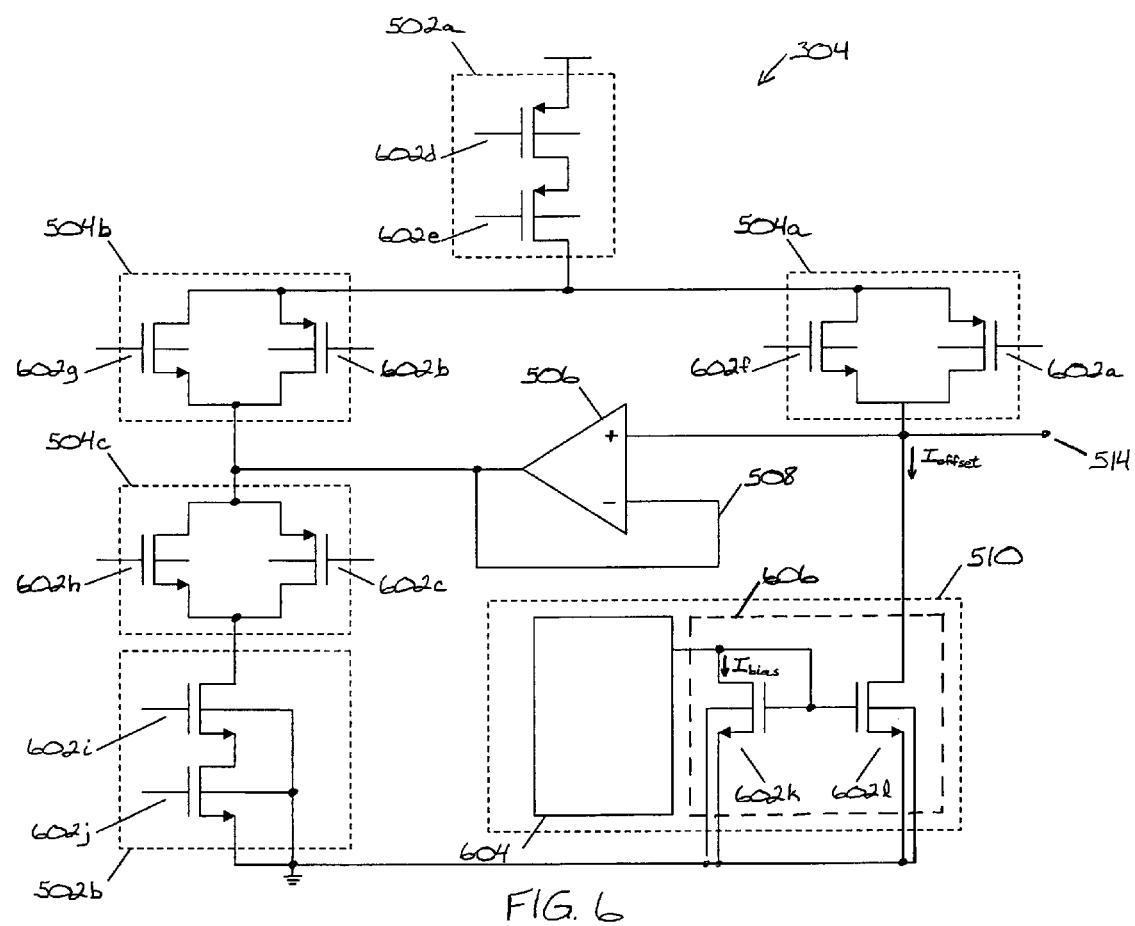

FIG. 6 is another example block diagram of charge pump 304, according to an embodiment of the present invention. In FIG. 6, offset current circuit 510 includes a digital-to-analog converter (DAC) 604 and a bias mirror 606. Bias mirror 606 includes a transistor 6021 and a diode-connected transistor 602k, each of which has a gate, a drain, and a source. The gate and the drain of diode-connected transistor 602k are connected together. The gates of diode-connected transistor 602k and transistor 6021 are connected together. The sources of diode-connected transistor 602k and transistor 6021 are connected to a ground potential, though the scope of the present invention is not limited in this respect. The sources of diode-connected transistor 602k and transistor 6021 may be coupled to any voltage potential.

DAC 604 converts a digital representation of a bias (e.g., a voltage or a current) to an analog bias signal. In FIG. 6, the analog bias signal provided by DAC 604 is a current. The current $I_{bias}$ flowing through diode-connected transistor 602k is "mirrored" at transistor 6021. In other words, the current $I_{bias}$ flowing through diode-connected transistor 620k and the current $I_{offset}$ flowing through transistor 6021 are the same, assuming that transistor 6021 and diode-connected transistor 602k are the same size. Based on this assumption, $I_{offset}=I_{bias}$. However, transistor 6021 and diode-connected transistor 620k need not necessarily be the same size. For example, if transistor 6021 is larger than diode-connected transistor 620k, then $I_{offset}>I_{bias}$, though the current $I_{offset}$ increases/decreases as the current $I_{bias}$ increases/decreases. In another example, if transistor 6021 is smaller than diode-connected transistor 620k, then $I_{offset}<I_{bias}$, though the current $I_{offset}$ increases/decreases as the current $I_{bias}$ increases/decreases.

Offset current circuit 510 provides $I_{offset}$ at output 514 of charge pump 304, thereby modifying the charge phase characteristic of charge pump 304. In an aspect, providing $I_{offset}$ at output 514 of charge pump 304 moves the bias point of charge pump 304 from the zero point of charge phase relationship 400 described above with reference to FIG. 4. In another aspect, $I_{offset}$ moves the charge phase characteristic of charge pump 304 from non-linear portion 404 of charge phase relationship 400 in FIG. 4 to linear portion 402 or linear portion 406 of charge phase relationship 400. In yet another aspect, $I_{offset}$ has sufficient magnitude to prevent voltage swings at output 514 of charge pump 304 from causing the charge phase relationship of charge pump 304 to overlap with non-linear portion 404.

Referring to FIG. 6, first current source 502a includes transistor 602d and transistor 602e. Transistor 602e is cascode coupled to transistor 602d to increase the output resistance of first current source 502a. Transistor 602e reduces output variations of first current source 502a, thereby improving linearity of first current source 502a. Second current source 502b includes transistor 602i and transistor 602j. Transistor 602j is cascode coupled to transistor 602i to increase the output resistance of second current source 502b. Transistor 602i reduces output variations of second current source 502b, thereby improving matching between first current source 502a and second current source 502b. Charge pump 304 need not necessarily include transistor 602e and/or transistor 602i.

In FIG. 6, switches 504a-c each include a respective PMOS transistor 602a-c and a respective NMOS transistor 602f-h. In first switch 504a, transistor 602a and transistor 602f are complementary coupled. In other words, a source of transistor 602a and a drain of transistor 602f are coupled to each other, and a drain of transistor 602a and a source of transistor 602f are coupled to each other. In second switch 504b, transistor 602b and transistor 602g are complementary coupled. In third switch 504c, transistor 602c and transistor 602h are complementary coupled.

In an aspect, gates of respective transistors 602b, 602c, and 602f are controlled by a first signal. First signal is inverted to provide a second signal. Gates of respective transistors 602a, 602g, and 602h are controlled by the second signal. Transistors 602a and 602f are turned on when transistors 602b, 602c, 602g, and 602h are turned off. Transistors 602a and 602f are turned off when transistors 602b, 602c, 602g, and 602h are turned on. In the embodiment of FIG. 6, the current associated with the first signal is referred to as the charge pump current $I_{CP}$.

In FIG. 6, and referring back to FIGS. 3A and 3B, the offset current $I_{offset}$ provided by offset current circuit 510 at output 514 of charge pump 304 corresponds with a timing offset $t_{offset}$ for feedback signal 324. The timing offset $t_{offset}$ is related to the offset current $I_{offset}$ according to the following equation:

$$t_{offset} = T_{ref} * \left( \frac{I_{offset}}{I_{CP}} \right), \quad \text{(Equation 1)}$$

where $T_{ref}$ is the period of reference signal 322 provided to phase frequency detector 302. The period $T_{ref}$ of reference signal 322 equals the inverse of the frequency $f_{ref}$, which is represented by the following equation:

$$T_{ref} = \frac{1}{f_{ref}}.$$ (Equation 2)

For example, if reference signal 322 is a 1 mA signal having a frequency $f_{ref}$ of 10 MHz, then an offset current $I_{offset}$ of 100 µA provides a timing offset $t_{offset}$ of 10 ns for feedback signal 324. Following is a mathematical calculation of the timing offset $t_{offset}$ of feedback signal 324 for this example:

$$t_{offset} = \left(\frac{1}{10^7 \text{ Hz}}\right) * \left(\frac{10^{-4} A}{10^{-3} A}\right) = 10^{-8} s = 10 \text{ ns}.$$

The timing offset $t_{offset}$ effects the phase of feedback signal 324, thereby effecting the phase difference associated with the phase error signal provided to charge pump 304 by phase frequency detector 302. As shown in Equation 1, the offset current $I_{offset}$ is directly proportional to the timing offset $t_{offset}$. Thus, the offset current $I_{offset}$ may be varied to vary the phase difference associated with the phase error signal provided to charge pump 304. Changing the phase error signal provided to charge pump 304 changes the charge provided at output 514 of charge pump 304.

For example, a phase error signal indicating a relatively greater phase difference between reference signal 322 and feedback signal 324 corresponds with a relatively greater magnitude of charge provided at output 514 of charge pump 304. A phase error signal indicating a relatively lesser phase difference between reference signal 322 and feedback signal 324 corresponds with a relatively lesser magnitude of charge provided at output 514 of charge pump 304.

According to an embodiment, a positive phase difference associated with the phase error signal corresponds with a positive charge provided at output 514 of charge pump 304. In this embodiment, a negative phase difference associated with the phase error signal corresponds with a negative charge provided at output 514. According to another embodiment, a positive phase difference associated with the phase error signal corresponds with a negative charge provided at output 514 of charge pump. In this embodiment, a negative phase difference associated with the phase error signal corresponds with a positive charge provided at output 514.

Generating timing offset $t_{offset}$ facilitates biasing charge pump 304 to have a linear charge phase characteristic. For example, the timing offset $t_{offset}$ may be set such that the phase difference associated with the phase error signal corresponds with a point along linear region 402 or 406 of charge phase relationship 400 in FIG. 4.

V. Example Method

FIG. 7 illustrates a flowchart 700 of a method of biasing a charge pump to have a linear charge phase characteristic in accordance with an embodiment of the present invention. The invention, however, is not limited to the description provided by the flowchart 700. Rather, it will be apparent to persons skilled in the relevant art(s) from the teachings provided herein that other functional flows are within the scope and spirit of the present invention.

Flowchart 700 will be described with continued reference to example charge pump 304 described above in reference to FIGS. 3A-6, though the method is not limited to those embodiments.

Referring now to FIG. 7, offset current circuit 510 provides an offset current at the positive input terminal of operational amplifier 506, as shown at block 710. In an aspect, providing offset current at block 710 prevents the charge phase characteristic of charge pump 304 from overlapping with non-linear portion 404 of charge phase relationship 400 shown in FIG. 4. Feedback 508 feeds back the output of operational amplifier 506 to the negative input terminal of operational amplifier 506 at block 720. For instance, feeding back the output of operational amplifier 506 at block 720 enables operational amplifier 506 to set a voltage at the output terminal of operational amplifier 506 to be substantially the same as the voltage at the positive input terminal of operational amplifier 506. At block 730, saturation maintenance circuit 512 enables operational amplifier 506 to maintain the voltage at the positive input terminal of operational amplifier 506 and at the output terminal of operational amplifier 506 with a lower power consumption, as compared to a design that does not include saturation maintenance circuit 512, because operational amplifier 506 only needs to provide an output current equal to the mismatch between a current provided by first current source 502a and a current provided by second current source 502b. In an aspect, the voltage remains the same, regardless whether first switch 504a is open or closed.

VI. Conclusion

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above described exemplary embodiments, but should be defined only in accordance with the following claims and their equivalents.

What is claimed is:

1. A charge pump for providing a charge based on a phase difference between a first and second signal, the charge pump comprising:
   an operational amplifier having an output terminal, a positive input terminal, and a negative input terminal;
   a first switch coupled between a first current source and the positive input terminal;
   a second switch coupled between the first current source and the output terminal;
   a third switch coupled between the output terminal and a second current source; and
   an offset current circuit coupled to the positive input terminal,
   wherein the offset current circuit is configured to move a bias point of the charge pump, using an offset current, away from a zero point such that the charge pump provides a non-zero charge if the phase difference is zero,
   wherein the offset current circuit includes a current mirror that is configured to receive a bias current from a digital-to-analog converter, and
   wherein the bias current is coupled to a diode-connected transistor of the current mirror that is configured to establish the offset current, proportional to the bias current, in a separate transistor.

2. The charge pump of claim 1, wherein the negative input terminal and the output terminal are coupled together.

3. The charge pump of claim 1, wherein the first switch includes a first NMOS transistor and a first PMOS transistor coupled in parallel with each other, wherein the second switch includes a second NMOS transistor and a second PMOS transistor coupled in parallel with each other, and wherein the third switch includes a third NMOS transistor and a third PMOS transistor coupled in parallel with each other.

4. The charge pump of claim 1, wherein the first current source includes a first P-type transistor and a second P-type transistor cascode coupled to the first P-type transistor, and wherein the second current source includes a first N-type transistor and a second N-type transistor cascode coupled to the first N-type transistor.

5. The charge pump of claim 1, wherein the offset current circuit is configured to maintain a non-zero charge at the positive input terminal.

6. The charge pump of claim 1, wherein the third switch enables the operational amplifier to maintain a voltage at the positive input terminal and at the output terminal with a relatively low power consumption.

7. The charge pump of claim 1, wherein the third switch is configured to reduce a turn-on delay associated with the first switch.

8. A system comprising:
a phase frequency detector configured to provide a phase error signal based on a difference between a reference signal and a feedback signal;
a charge pump configured to provide a charge based on the phase error signal, the charge pump including:
an operational amplifier having an output terminal, a positive input terminal, and a negative input terminal,
a first switch coupled between a first current source and the positive input terminal,
a second switch coupled between the first current source and the output terminal,
a third switch coupled between the output terminal and a second current source, and
an offset current circuit coupled to the positive input terminal, wherein the offset current circuit is configured to move a bias point of the charge pump, using an offset current, away from a zero point such that the charge pump provides a non-zero charge when the phase error signal is zero;
a voltage controlled oscillator configured to provide a system output signal based on the charge; and
a multi-modulus divider capable of dividing a frequency of the system output signal by a non-integer value to provide the feedback signal,
wherein the offset current circuit includes a current mirror that is configured to receive a bias current from a digital-to-analog converter, and
wherein the bias current is coupled to a diode-connected transistor of the current mirror that is configured to establish an offset current, proportional to the bias current, in a separate transistor.

9. The system of claim 8, further comprising:
a sigma-delta modulator configured to provide a fractional value; and
an adder configured to combine the fractional value and an integer value to generate the non-integer value.

10. The system of claim 8, further comprising:
a re-timing circuit coupled between the multi-modulus divider and the phase frequency detector to reduce jitter associated with the feedback signal.

11. The system of claim 8, further comprising:
a pre-scaler circuit coupled between the voltage controlled oscillator and the multi-modulus divider to reduce power consumption of the multi-modulus divider.

12. The system of claim 8, wherein the negative input terminal and the output terminal of the operational amplifier are coupled together.

13. The system of claim 8, wherein the first current source includes a first P-type transistor and a second P-type transistor cascode coupled to the first P-type transistor, and wherein the second current source includes a first N-type transistor and a second N-type transistor cascode coupled to the first N-type transistor.

14. The system of claim 8, wherein the offset current circuit is configured to maintain a non-zero charge at the positive input terminal of the operational amplifier.

15. The system of claim 8, wherein the third switch is configured to reduce a turn-on delay associated with the first switch.

16. The system of claim 8, wherein a charge at the positive input terminal is based on a current $I_{off}$ provided by the offset current circuit, wherein a period $T_{ref}$ of the reference signal is offset by a time $t_{off} = T_{ref} * (I_{off}/I_{CP})$, and wherein $I_{CP}$ is a current that controls the first switch.

17. A charge pump for providing a charge based on a phase difference between a first and second signal, the charge pump comprising:
an operational amplifier having a positive input terminal, a negative input terminal, and an output terminal;
an offset current circuit coupled between the positive input terminal and a node, wherein the offset current circuit is configured to move a bias point of the charge pump, using an offset current, away from a zero point such that the charge pump provides a non-zero charge if the phase difference is zero;
a first switch coupled between a first current source and the positive input terminal to selectively increase charge at the positive input terminal; and
a saturation maintenance circuit coupled between the first current source and the node to facilitate maintenance of the first current source in saturation,
wherein the offset current circuit includes a current mirror that is configured to receive a bias current from a digital-to-analog converter, and
wherein the bias current is coupled to a diode-connected transistor of the current mirror that is configured to establish the offset current, proportional to the bias current, in a separate transistor.

18. The charge pump of claim 17, wherein the saturation maintenance circuit includes a second switch coupled between the first current source and the output terminal.

19. The charge pump of claim 18, wherein the saturation maintenance circuit further includes a third switch and a second current source series connected between the output terminal and the node.

20. The charge pump of claim 18, wherein the third switch enables the operational amplifier to maintain a voltage at the positive input terminal and at the output terminal.

21. The charge pump of claim 18, wherein the third switch is configured to reduce a turn-on delay associated with the first switch.

* * * * *